(12) United States Patent
Brabec et al.

(10) Patent No.: US 7,317,210 B2
(45) Date of Patent: Jan. 8, 2008

(54) ORGANIC LIGHT EMITTING DIODE, METHOD FOR THE PRODUCTION THEREOF AND USES THEREOF

(75) Inventors: Christoph Josef Brabec, Erlangen (DE); Herbert Schewe, Herzogenaurach (DE); Georg Wittmann, Herzogenauchrach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 79 days.

(21) Appl. No.: 10/487,566

(22) PCT Filed: Aug. 20, 2002

(86) PCT No.: PCT/DE02/03044

§ 371 (c)(1),
(2), (4) Date: Feb. 23, 2004

(87) PCT Pub. No.: WO03/019658

PCT Pub. Date: Mar. 6, 2003

(65) Prior Publication Data

US 2005/0260777 A1 Nov. 24, 2005

(30) Foreign Application Priority Data

Aug. 21, 2001 (DE) ................. 101 40 991

(51) Int. Cl.
*H01L 27/15* (2006.01)
(52) U.S. Cl. .............. 257/79; 257/40; 257/82
(58) Field of Classification Search ........... 438/22, 438/26, 57, 99, 106, 127; 257/40, 79, 1
See application file for complete search history.

(56) References Cited

U.S. PATENT DOCUMENTS

| | | | |
|---|---|---|---|
| 5,333,183 A | 7/1994 | Herbert | |
| 5,454,880 A | 10/1995 | Sariciftci et al. | |
| 5,670,791 A | 9/1997 | Halls et al. | |
| 6,028,327 A * | 2/2000 | Mizoguchi et al. | 257/98 |
| 6,522,067 B1 * | 2/2003 | Graff et al. | 313/512 |
| 6,706,963 B2 | 3/2004 | Gaudiana et al. | |
| 6,812,399 B2 | 11/2004 | Shaheen et al. | |
| 6,866,901 B2 * | 3/2005 | Burrows et al. | 428/1.5 |
| 6,933,436 B2 | 8/2005 | Shaheen et al. | |
| 2002/0066904 A1 * | 6/2002 | Yuan et al. | 257/83 |

(Continued)

FOREIGN PATENT DOCUMENTS

AT 409 902 B 12/2002

(Continued)

OTHER PUBLICATIONS

Rogers, J.A., "Rubber Stamping for Plastic Electronics and Fiber Optics", Jul. 2001, Materials Research Society Bulletin, pp. 530-534.

*Primary Examiner*—Tuan H. Nguyen
(74) *Attorney, Agent, or Firm*—Fish & Richardson P.C.

(57) ABSTRACT

The invention relates to an organic light emitting diode (OLED), also referred to as a light emitting diode, which comprises at least one substrate, one anode, one hole transport layer, one emitter layer, one cathode and one encapsulation. It is proposed that an energy carrier, which supplies the voltage that causes the OLED to emit light, be integrated into the OLED. The energy carrier can be a battery (energy storage device) or an energy converter (photovoltaic element).

29 Claims, 6 Drawing Sheets

U.S. PATENT DOCUMENTS

| | | |
|---|---|---|
| 2003/0081158 A1* | 5/2003 | Li et al. .................... 349/113 |
| 2004/0233502 A1 | 11/2004 | Brabec et al. |
| 2006/0107996 A1 | 5/2006 | Shaheen et al. |

FOREIGN PATENT DOCUMENTS

| | | |
|---|---|---|
| EP | 1083612 | 3/2001 |
| JP | 01206674 A | 8/1989 |
| JP | 11354773 A | 12/1999 |
| JP | 2000182770 A | 6/2000 |
| WO | WO 99/39395 | 8/1999 |
| WO | WO 99/53472 | 10/1999 |
| WO | WO00/05701 | 2/2000 |
| WO | WO01/83067 | 11/2001 |

* cited by examiner

ORGANIC LIGHT EMITTING DIODE, METHOD FOR THE PRODUCTION THEREOF AND USES THEREOF

BACKGROUND

The invention relates to an organic light emitting diode (OLED), also referred to as a light emitting diode, which comprises at least one substrate, one anode, one emitter layer and one cathode, and has a new type of energy supply.

Light emitting diodes are known that show luminescence with simultaneous current flow as a result of the application of voltage. A disadvantage of the OLEDs known to date is that they derive their energy exclusively from an external electrical power supply.

SUMMARY

Techniques for forming a light emitting device are described. The device has one or more substrates, a light emitting diode and an energy source. The light emitting diode is supported by the one or more substrates and has a first electrode, an emitter layer disposed on the first electrode and a second electrode disposed on the emitter layer. The energy source applies a voltage to the light emitting diode and is supported by the one or more substrates. The energy source can be an energy converter, such as a photovoltaic element, or an energy storage device. The energy source and the light emitting diode can be encapsulated or can be integrated into the same encapsulation. The energy source and the organic light emitting diode can be supported by one or more substrates where at least one of the one or more substrates encapsulates the energy source and light emitting diode.

DETAILED DESCRIPTION

The goal of the invention is to create an OLED with an integrated energy carrier, so that the OLED can be operated in mobile manner, i.e., at least partly independent of a power source.

The subject matter of the invention is an organic light emitting diode (OLED), comprising at least one substrate, one anode, one emitter layer and one cathode, wherein an energy carrier is integrated into the OLED, so that a voltage can be applied to the OLED, either through switching and/or through environmental influence. A production process for producing an OLED with an integrated energy carrier is also a subject matter of the invention and, finally, a subject matter of the invention is the use of such OLEDs in displays and/or in electronic paper, as described, for example, in "Rubber Stamping for Plastic Electronics and fiber Optics" by John A. Rogers, in MRS (Materials Research Society) Bulletin, July 2001, pages 530 to 532.

An energy storage device, such as a conventional or rechargeable battery and/or an energy converter, such as a photovoltaic cell or solar cell, can be used as an energy carrier.

Radiation (especially light radiation in the visible spectrum, such as that generated by common lighting fixtures or by sunshine), heat, pressure or a source of sound can be used as an environmental influence.

According to one embodiment of the OLED, the energy carrier, such as the photovoltaic cell, acts in such a way that it is simultaneously a photodetector that detects, for example, when the mobile telephone is removed from a pocket and/or the cover of the mobile telephone is opened. In this manner, a network operator of the mobile telephone, which uses a relatively large amount of current, can only be activated in suitable ambient light. When the mobile telephone is in the light but not in operation, the solar cell supplies the energy and the signal to activate the network operator on the display as needed.

The energy carrier, which must at least also serve as an energy storage device, can be switched on and off by means of a circuit.

Because only small amounts of energy are necessary to operate an OLED, the electric power can be generated, in part or in full, through photovoltaic cells as energy converters. In this process, semitransparent photovoltaic elements are recommended, which can be disposed on the transparent side of the OLED and, specifically, in such a way that, for example, the entire surface of the OLED is made usable for energy conversion.

Semitransparent photovoltaic elements preferably have a photovoltaic layer which is not silicon-based but is constructed on the basis of organic material.

A suitable photovoltaic layer, such as the materials described in U.S. Pat. Nos. 5,454,880 and 5,333,183, among others, can comprise one or more semiconducting plastics that can exist in monomer, oligomer and/or polymer form, as well as inorganic particles and/or nanoparticles. A mixture of two or more conjugated organic plastics, inorganic particles and/or nanoparticles with similar or different electron affinities and/or with similar or different band gaps can be present.

Thin layers of organic molecules, oligomers and molecular mixtures can be produced by thermal vapor deposition or chemical/physical vapor deposition (CVD), for example.

Thin layers of conjugated polymers and mixtures with conjugated polymers can be produced by spin-coating (solution spinning), but also by other common printing methods, such as silk screen printing, ink jet printing, flexographic printing or rotogravure (or other/similar solvent deposition processes). If polymers are used, these layers can also be deposited onto flexible substrates.

Examples of typical semiconducting conjugated polymers include polyacetylene (PA) and derivatives thereof, polyisothianaphtene (PITN) and derivatives thereof, polythiophene (PT) and derivatives thereof, polypyrroles (PPr) and derivatives thereof, poly(2,5-theinylenevinylene) (PTV) and derivatives thereof, polyfluorene (PF) and derivatives thereof, poly(p-phenylene) (PPP) and derivatives thereof, poly(phenylene vinylene) (PPV) and derivatives thereof, as well as polyquinoline and derivatives thereof, polycarbazol and derivatives thereof, and semiconducting polyaniline (leukoemeraldine and/or leukoemeraldine base).

Examples of acceptors in donor/acceptor polymer mixtures include, but are not limited to poly-(cyanophenylenevinylene), fullerene such as C60 and its functional derivatives (such as PCBM, PCBR), and organic molecules, organometallic molecules or inorganic nanoparticles (such as CdTe, CdSe, CdS, CIS).

Solar cells that are used can also be constructed in two separate layers, in which the donor is spatially separated from the acceptor (such as PT/C60 or PPV/C60).

According to a preferred embodiment of the invention, the OLED has a layer of semitransparent photovoltaic elements, wherein one of the electrodes of the OLED also serves as an electrode for the photovoltaic element. Not only does this reduce production costs, because the production of an electrode layer for the photovoltaic element is eliminated, but the material and spatial requirements for the energy converter are also reduced.

According to a preferred embodiment, the energy carrier is transparent or at least semitransparent. If the energy converter comprises cells and/or is transparent or semitransparent, it is recommended that the energy converter be disposed within the OLED in such a way that the energy converter is mounted on the side of the OLED facing the light source, so that there is no obstruction of the radiation falling onto the photovoltaic cells.

Transparent ITO (indium tin oxide) or gold (Au), for example, are used as the anode for an OLED.

Preferably, the OLED also has a hole transport layer. A layer of conductive, semitransparent PANI and/or PEDOT/PSS, for example, is used for this purpose.

PPV and/or PF as well as their derivatives, for example, are used as an emitter layer and/or electron guiding layer.

Ca, Sm, Y, Mg, Ak, In, Cu, Ag, Au, LiF/Al, LiF/Ca, for example, are used as a cathode.

Preferably, the OLED is also encapsulated. A glass layer, for example, that is glued, laminated, etc. to the OLED (solar cell) may be used for this purpose.

According to a preferred embodiment, there is at least one semitransparent insulation layer between the OLED and the solar cell. In addition to encapsulation and electrical insulation, this layer can also have other functions, such as oxygen and/or water stabilizers, polarizers for OLEDs color filter, anti-reflection layer for OLED and/or solar cells, refractive index matcher, etc.

Because it is often difficult to obtain pure colors with the OLED displays, the solar cells can also be used as color filters to filter the interfering portion out of the overall OLED emission.

In the following, the invention is explained on the basis of a few figures, which show the preferred embodiments with at least one photovoltaic element as an energy converter.

Figure 1:
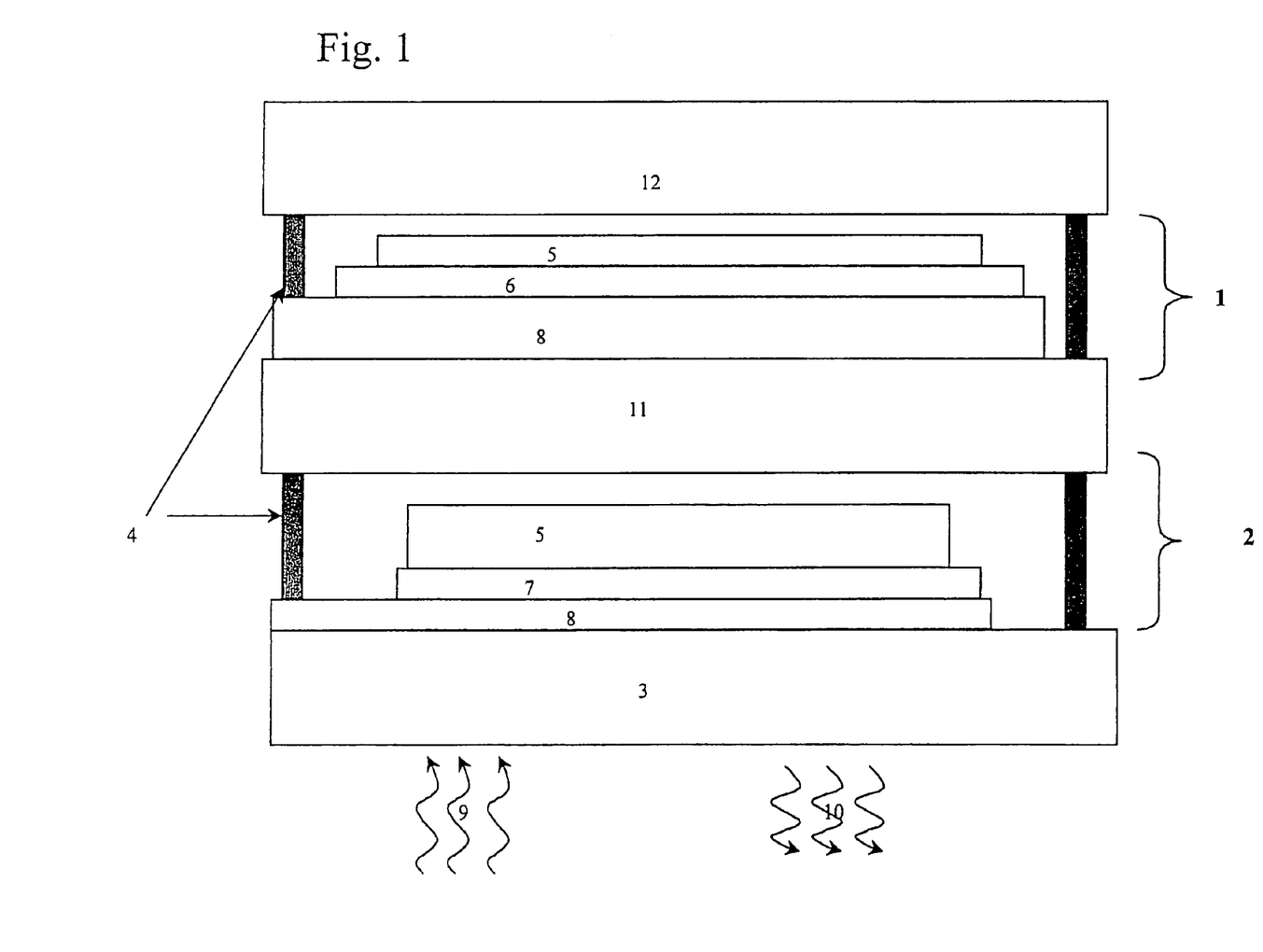
FIGS. 1 to 6 show the combination of an OLED with a semitransparent solar cell.

In FIG. 1, one can see the combination of an OLED 1 with a semitransparent solar cell 2, in which both the solar cell 2 and the OLED 1 are produced separately. From bottom to top, one can see the substrate 3 (such as glass or a flexible film) with a spacer 4. The incident light (arrows 9) and, in reverse direction, the emission of the OLED, indicated by the arrows 10, penetrate through this substrate. Disposed on this substrate 3 are the positive electrode, the anode 8, which can be made of ITO (indium tin oxide), for example, on the anode 8 the semitransparent photoactive layer 7 of the solar cell 2 (the absorber), and the cathode 5, which can be made of calcium (Ca), for example. The solar cell 2 is sealed by the semitransparent insulation layer 11. Spacers 4 protect the cathode 5 against damage. The semitransparent insulation layer 11 serves as a substrate for the OLED 1. The OLED 1 is constructed on it: What can be seen, again from bottom to top, is first the anode 8, then the photoactive layer of the OLED 6 (the emitter), on top of it the cathode 5 and, finally, the encapsulation or seal 12, which is comprised of glass, for example.

The OLED 1 can then be sealed, for example, and the semitransparent insulation layer 11 (or the substrate 11) of the OLED 1 serves, in turn, as a seal for the solar cell 2.

Figure 2:
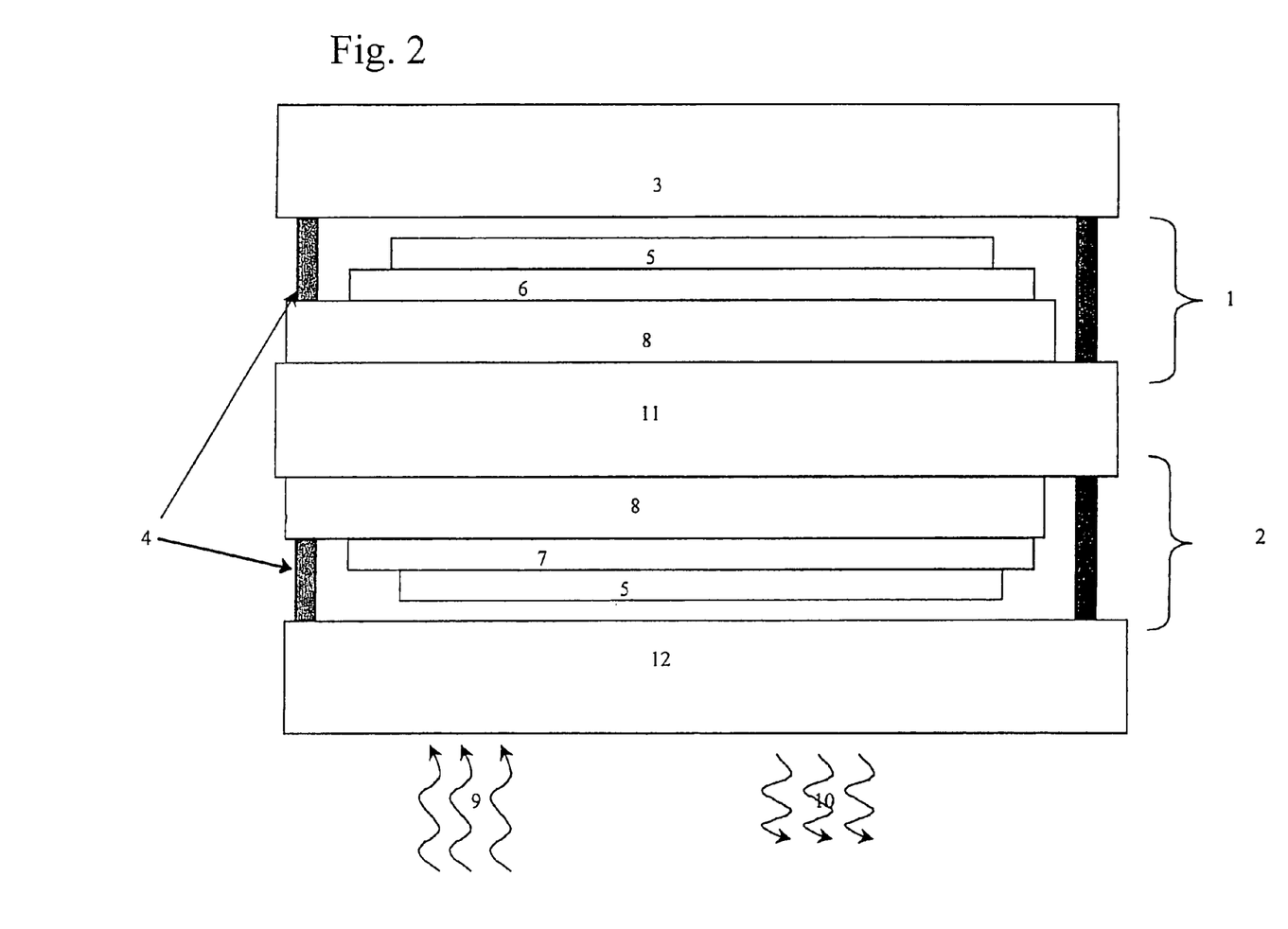

FIG. 2 is largely the same as FIG. 1. What can be seen is the combination of an OLED 1 with a semitransparent solar cell 2, in which both the solar cell 2 and the OLED 1 are produced on the same substrate, the semitransparent insulation layer 11, which, in this case, is coated on both sides. The OLED 1 and the solar cell 2 can then be sealed separately. In this connection, the anodes 8 of the components OLED 1 and solar cell 2 are adjacent to the two sides of the semitransparent insulation layer 11, followed by their respective photoactive layers 6 and 7 and, finally, their cathodes 5.

Figure 3:
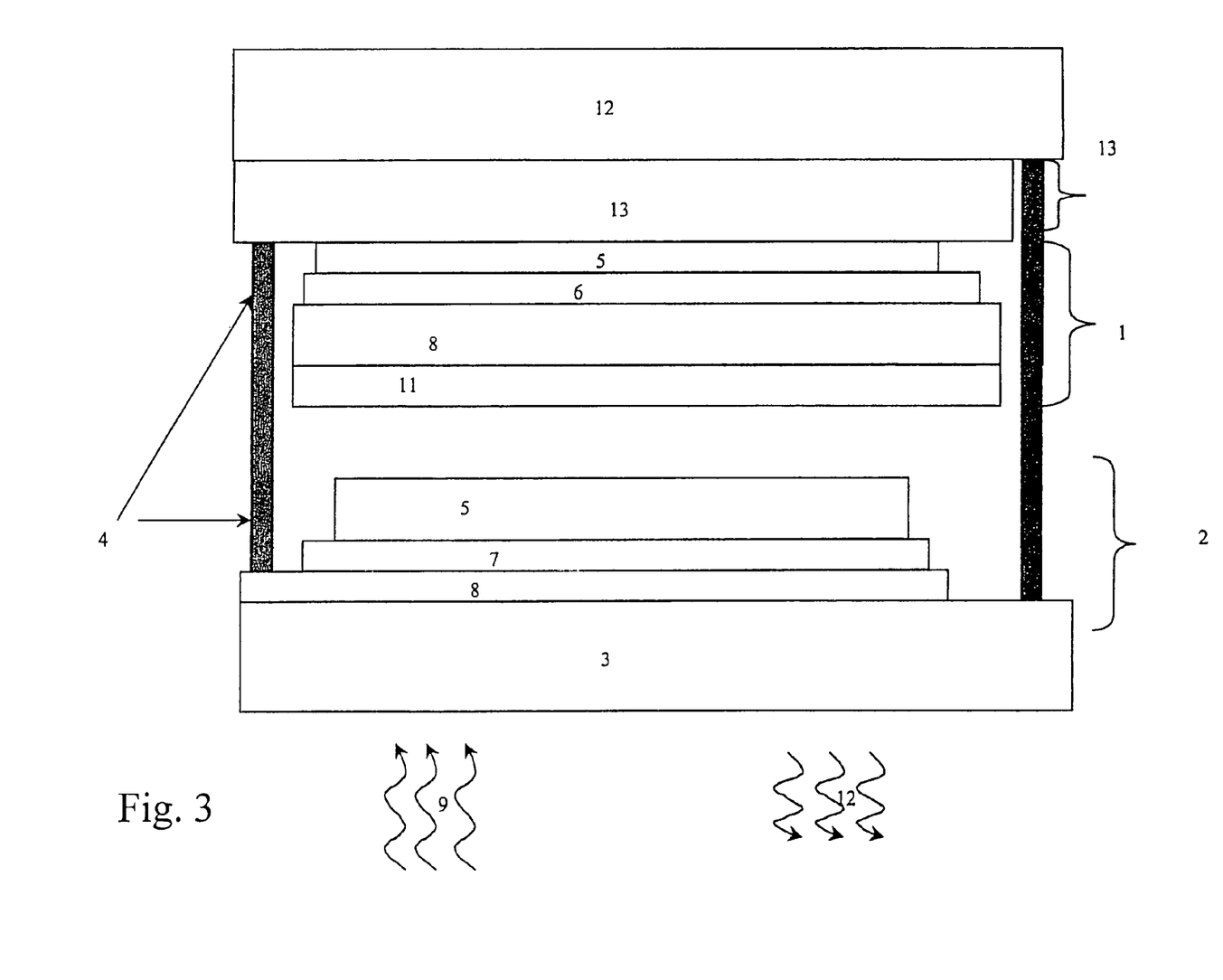

FIG. 3 shows a structure in which the OLED 1 is applied in a self-supporting manner, through a connecting electrode or conductive electrode 13, to the upper sealing layer 12, which can be made of glass, for example. The OLED 1 is applied to the conductive electrode 13, which can be an aluminum adhesive strip, carbon black or another form of intermediate layer, by means of printing, gluing, etc. The connecting or conductive electrode 13 is followed by the cathode 5, the photoactive layer 6 and the semitransparent insulation layer 11, which is a thin substrate that can also be flexible. The insulation layer 11 can also be referred to here as a planarization layer.

The self-supporting OLED 1 is separated from the lower semitransparent solar cell 2 by the spacers 4. The structure of the semitransparent solar cell 2 corresponds to that shown in FIG. 1.

Shown here is the combination of an OLED 1 with a semitransparent solar cell 2, in which the solar cell 2 is produced separately. Either the OLED 1 can be produced from an optional independent substrate 12, sealed, and then connected to the connecting electrode 13, which is also a conductive electrode, or the two individual elements are sealed together by the spacers 4.

The example shown in FIG. 4 is again similar, in terms of its principle parts, to the structure from FIG. 1, in which the OLED 1 is shown in the center as a substrate and the encapsulation of the solar cell 2 as a thin substrate, which can be optionally provided with a getter function. This is the combination of an OLED 1 with a semitransparent solar cell 2, in which the solar cell 2 is produced separately. The OLED 1 is, for example, structured in reverse order. The two individual elements are sealed together.

Figure 4:
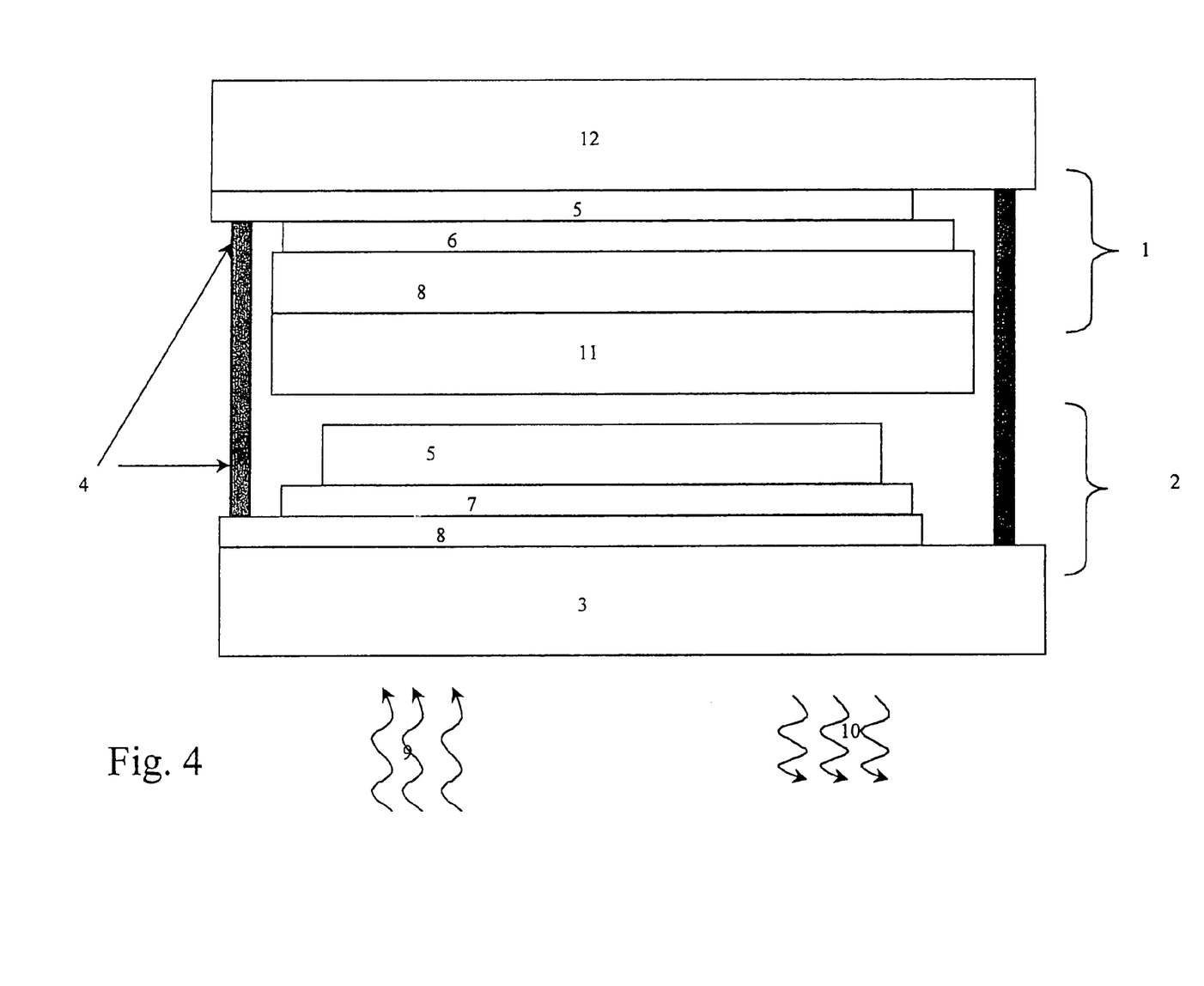
Figure 5:
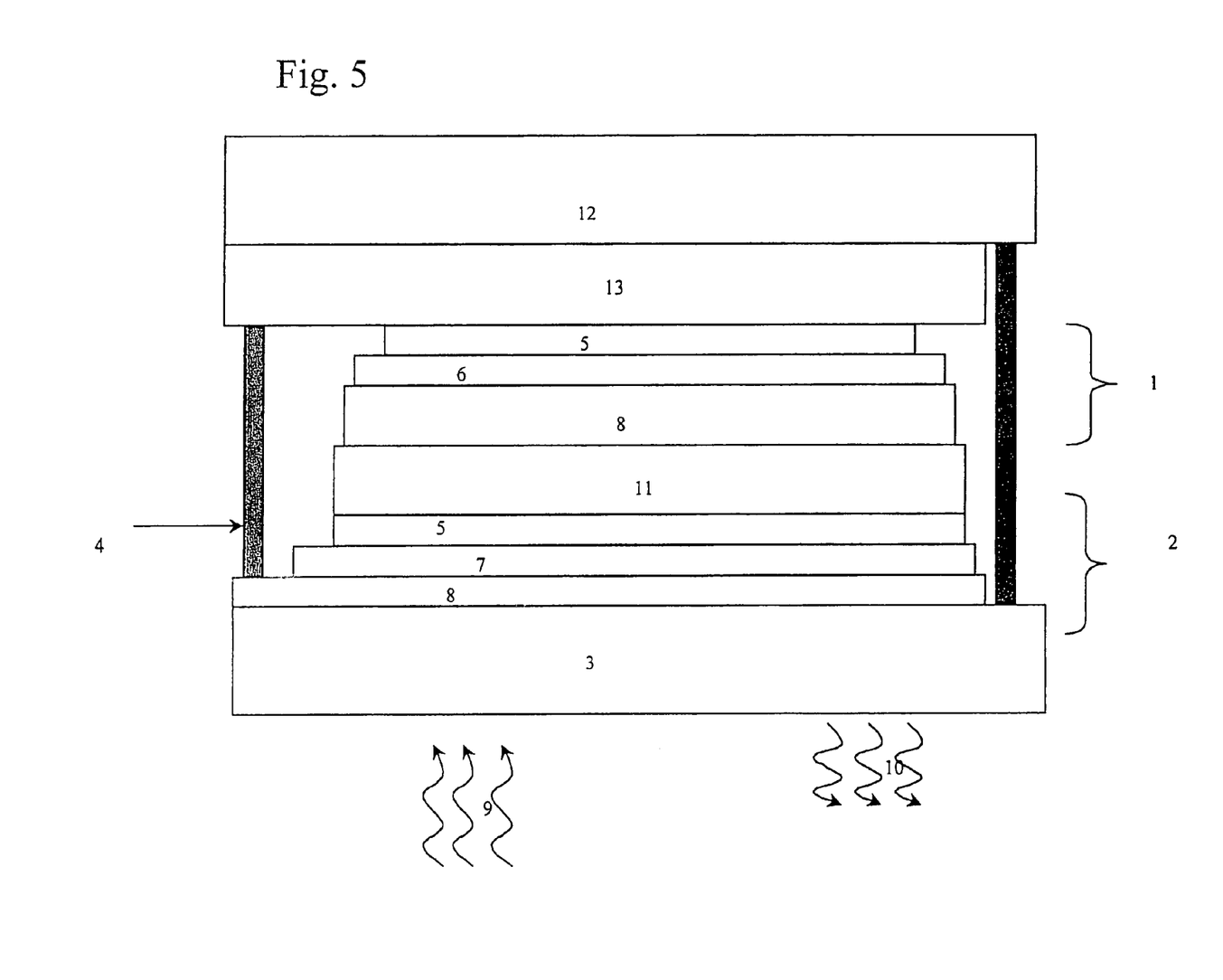

Elements known from FIGS. 3 and 4 are connected in FIG. 5. Here, as an option, the individual elements OLED 1 and solar cell 2 can be designed to be monolithic relative to one another. First, the solar cell 2 is produced on the substrate 3, which is coated with the anode 8, and is then sealed with a semitransparent insulation layer 11, which can be an optional planarization layer and/or a thin substrate, which can also be flexible and/or be provided with a getter function. The OLED 1 is built onto this layer 11. Finally, the entire structure, which comprises the OLED 1 and the solar cell 2, is sealed by means of a suitable connecting electrode 13. It is also conceivable that the semitransparent insulation layer 11 be omitted and the OLED 1 be built onto the anode 8 of the solar cell 2. The OLED 1 and the solar cell 2 utilize the same electrodes. This embodiment is especially characterized by its compactness.

The semitransparent insulation layer 11 also makes it possible to produce the two cells individually and then glue them together using this layer.

Figure 6:
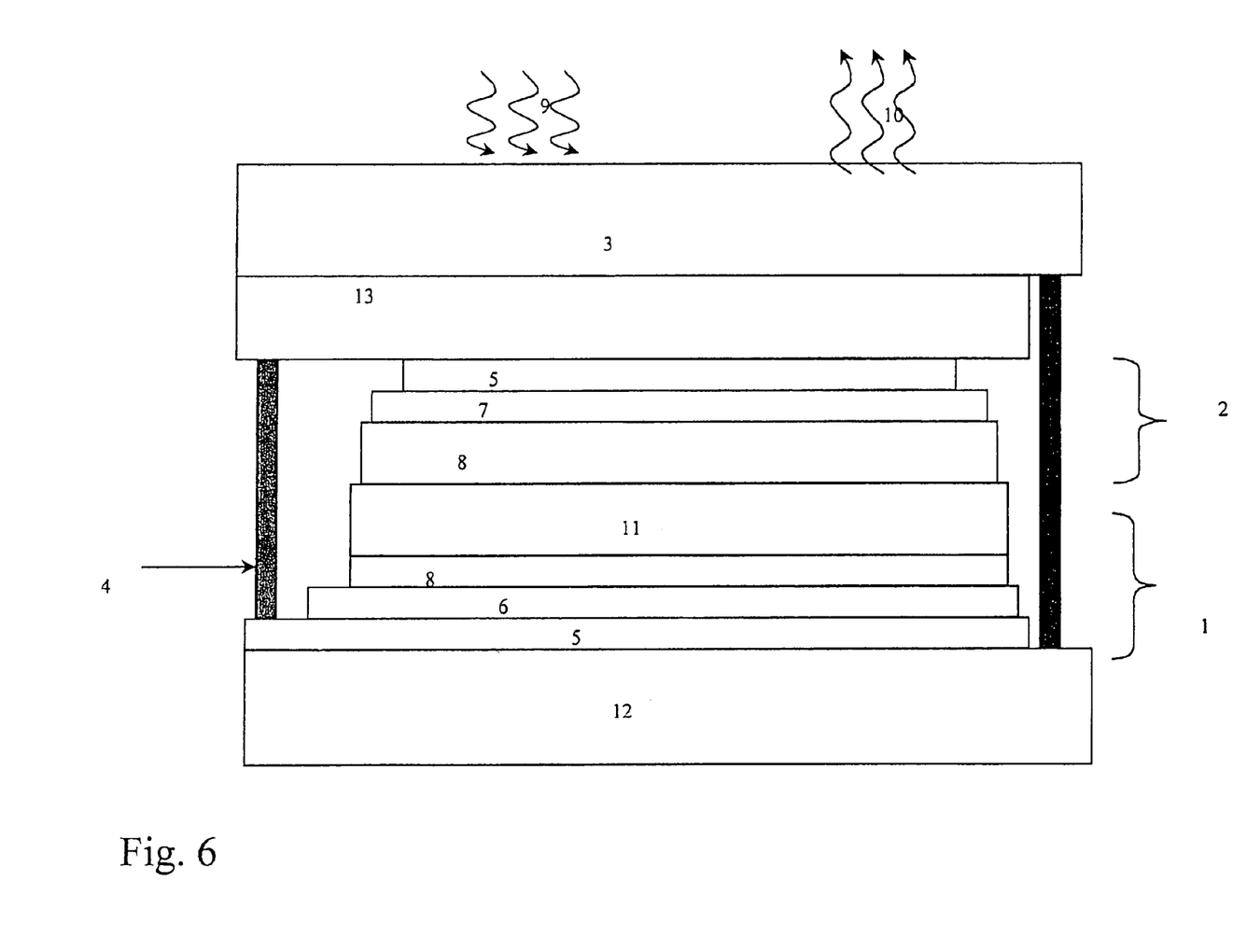

FIG. 6 shows an embodiment which, with the exception of the placement of the connecting electrode 13, is identical to that shown in FIG. 5. Here the connecting electrode 13 is disposed between the solar cell 2 and the substrate 3, through which the emission of the OLED 10 and the radiation 9 for the solar cell 2 passes.

This, therefore, is a combination of an OLED 1 and a semitransparent solar cell 2, in which the individual elements are designed to be monolithic relative to one another (see FIG. 5). In this case, however, construction occurs in the reverse order. The OLED 1 is first produced on a suitable substrate, and is then passivated or sealed with a semitransparent insulation layer 11 (optional), wherein the solar cell 2 is constructed on the optional insulation layer 11 or on the anode 8 of the OLED 1. Finally, the entire component is sealed by means of a suitable connecting electrode 13.

The optional insulation layer 11 also makes it possible to produce the OLED 1 and the solar cell 2 individually, and then glue them together using the insulation layer 11.

Again, it is conceivable that the semitransparent insulation layer 11 be omitted and the OLED 1 be built onto the anode 8 of the solar cell 2. Again, the OLED 1 and the solar cell 2 would utilize the same anode 8.

The functioning OLED can also comprise several modules, therefore, in most cases, control electronics will be indispensable. Likewise, several solar cells are presumably connected in series to supply the necessary operating voltage, although the solar cell(s) can also contribute to the operation voltage in combination with other energy carriers.

In general, the semitransparent insulation layer 11 in these structures can have a wide variety of functions. It can comprise an oxygen and/or water stabilizer, polarizer(s) for OLEDs, possibly color filters, anti-reflection layers for OLEDs or solar cells and/or refractive index matchers for solar cells and/or OLEDs, etc.

Although the figures only describe solar cells as energy carriers, by no means should the invention be limited to this type of energy carrier. Instead, energy storage devices such as rechargeable batteries can certainly also be described as preferred embodiments.

Likewise, the cathode/anode assignment in the examples is also simply coincidental and should not restrict the scope of the invention to be protected here. To a person skilled in the art, it is obvious that an operative device can also be obtained with a different choice of electrodes.

Similarly, the light source/semitransparent solar cells/OLED arrangement depicted here should not be restrictive. Instead, it is certainly also an aspect of the invention that the OLED can be produced to be semitransparent and that the energy carrier is not transparent and is disposed behind the OLED.

The invention relates to an organic light emitting diode (OLED), also referred to as a light emitting diode, which comprises at least one substrate, one anode, one hole transport layer, one emitter layer, one caThode, and one encapsulation. It is proposed that an energy carrier, which supplies the voltage that causes the OLED to emit light, be integrated into the OLED. The energy carrier can be a battery (energy storage device) or an energy converter (photovoltaic element).

What is claimed is:

1. A light emitting device, comprising:
   one or more substrates;
   an organic light emitting diode supported by the one or more substrates, wherein the organic light emitting diode comprises:
     a first electrode;
     an emitter layer disposed on the first electrode; and
     a second electrode disposed on the emitter layer; and
   an energy source to apply a voltage to the organic light emitting diode, wherein the energy source is supported by the one or more substrates;
   wherein the one or more substrates include an insulation layer that is at least semitransparent and the insulation layer is between the organic light emitting diode and the energy source.

2. The device according to claim 1, further comprising:
   an encapsulation that encapsulates the energy source.
3. The device according to claim 2, wherein:
   the encapsulation includes a sealing layer.
4. The device according to claim 1, further comprising:
   an encapsulation that encapsulates the organic light emitting diode.
5. The device according to claim 4, wherein:
   the encapsulation includes a sealing layer.
6. The device according to claim 1, wherein:
   the energy source is an energy converter.
7. The device according to claim 6, wherein:
   the energy converter comprises a photovoltaic element.
8. The device according to claims 1 wherein:
   the insulation layer comprises at least one of a planarizing layer, a thin substrate, a flexible layer or a getter layer.
9. The device according to claim 1, wherein:
   the energy source is an energy storage device.
10. The device according to claim 1, wherein:
    the energy source is at least semitransparent.
11. The device according to claim 1, wherein:
    the organic light emitting diode is supported by a first substrate of the one or more substrates;
    the energy source is supported by a second substrate of the one or more substrates; and
    the first and second substrates encapsulate the organic light emitting diode and the energy source.
12. The device according to claim 1, wherein:
    the organic light emitting diode is supported by a first side of a substrate of the one or more substrates; and
    the energy source is supported by a second side of the substrate of the one or more substrates.
13. A method for producing a light emitting device, comprising one or more substrates and an organic light emitting diode having an anode, an emitter layer and a cathode, wherein an energy source is integrated into the light emitting device to provide a voltage to the organic light emitting diode, comprising:
    forming an energy source which is supported by one or more substrates;
    forming an organic light emitting diode which is supported by the one or more substrates;
    forming an insulation layer that is at least semitransparent between the organic light emitting diode and the energy source;
    encapsulating the energy source.
14. The method of claim 13, wherein:
    forming the energy source includes forming a solar cell.
15. The method of claim 13, wherein:
    encapsulating the energy source includes encapsulating the organic light emitting diode.
16. A method for producing a light emitting device comprising one or more substrates and an organic light emitting diode having an anode, an emitter layer and a cathode, wherein an energy source is integrated into the light emitting device to provide a voltage to the organic light emitting diode, the method comprising:
    constructing an energy source supported by one or more substrates;
    encapsulating the energy source;
    providing a semitransparent insulation layer between the organic light emitting diode and the energy source;
    constructing an organic light emitting diode on the encapsulated energy source supported by the one or more substrates to form a combined energy source and organic light emitting diode; and encapsulating the combined energy source and organic light emitting diode.

17. The method of claim 16, wherein:
constructing an energy source on a substrate includes constructing a solar cell.

18. The method of claim 16, wherein the step of encapsulating the energy source includes encapsulating the energy source with an insulation layer that is at least semitransparent.

19. A method for producing a light emitting device, comprising one or more substrates, an organic light emitting diode having an anode, an emitter layer and a cathode, and an energy carrier including a photoactive layer that is at least semitransparent to light in the visible spectrum and is integrated into the light emitting device to provide a voltage to the organic light emitting diode, comprising:
    forming a first cathode supported by one or more substrates;
    forming a first photoactive layer on the first cathode;
    forming an anode on the photoactive layer;
    forming an emitter layer on the anode; and
    forming a second cathode on the emitter layer;
    wherein the energy carrier is in a light emitting path of the organic light emitting diode.

20. A method of operating a light emitting device that comprises one or more substrates, a light emitting diode supported by the one or more substrates having a first electrode, an emitter layer and a second electrode, wherein the emitter layer is between the first and second electrodes and at least one energy converter that is at least semitransparent is integrated into the organic light emitting device such that the first and second electrodes, emitter layer and energy source are encapsulated, the method comprising:
    supplying a voltage from the energy converter to the organic light emitting diode;
    applying the supplied voltage across the first electrode and the second electrode; and
    emitting light from the light emitting diode through the energy converter when the voltage is applied across the first and second electrodes.

21. The method of claim 20, further comprising:
    detecting an environmental influence selected from the group consisting of radiation, heat, pressure and sound, wherein detecting the environmental influence initiates the step of supplying a voltage.

22. An electronic paper, comprising:
one or more flexible substrates;
an organic light emitting diode supported by the one or more flexible substrates, wherein the organic light emitting diode comprises:
    a first electrode;
    an emitter layer disposed on the first electrode; and
    a second electrode disposed on the emitter layer; and
an energy source to apply a voltage to the organic light emitting diode wherein the energy source is supported by the one or more flexible substrates;
wherein the substrate, diode and energy source form a flexible display.

23. A light emitting device, comprising:
one or more substrates;
an organic light emitting diode supported by the one or more substrates, comprising:
    a first electrode;
    an emitter layer disposed on the first electrode; and
    a second electrode disposed on the emitter layer; and
an energy carrier that is at least semitransparent to light in the visible spectrum to apply a voltage to the organic light emitting diode, wherein the energy carrier is supported by the one or more substrates and is arranged in the light emitting path of the organic light emitting diode.

24. The device according to claim 23, wherein:
the organic light emitting diode contacts the energy source.

25. The device according to claim 23 wherein:
the energy source includes the first electrode of the organic light emitting diode.

26. The device according to claim 25, wherein:
the first electrode is an anode.

27. The device of claim 23, wherein the energy carrier is transparent.

28. The device of claim 23, wherein the energy carrier comprises organic material.

29. The device of claim 23, wherein the energy carrier comprises a photovoltaic cell.

* * * * *

UNITED STATES PATENT AND TRADEMARK OFFICE
CERTIFICATE OF CORRECTION

PATENT NO. : 7,317,210 B2 Page 1 of 1
APPLICATION NO. : 10/487566
DATED : January 8, 2008
INVENTOR(S) : Christoph Josef Brabec, Herbert Schewe and Georg Wittmann

It is certified that error appears in the above-identified patent and that said Letters Patent is hereby corrected as shown below:

On the Title page Item (75) Inventors; replace:

"Georg Wittmann, Herzogenauchrach (DE)"
-- Georg Wittmann, Herzogenaurach (DE) --

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,317,210 B2 |
| APPLICATION NO. | : 10/487566 |
| DATED | : January 8, 2008 |
| INVENTOR(S) | : Christoph Josef Brabec, Herbert Schewe and Georg Wittmann |

It is certified that error appears in the above-identified patent and that said Letters Patent is hereby corrected as shown below:

Column 6, Line 14 at Claim 8; replace:
 "The device according to claims 1 wherein:" with
 -- The device according to claim 1 wherein: --

Column 7, Line 19 at Claim 19; replace:
 "forming a first photoactive layer on the first cathode;" with
 -- forming a photoactive layer on the first cathode; --

Signed and Sealed this

Twenty-second Day of July, 2008

JON W. DUDAS
*Director of the United States Patent and Trademark Office*